US012635452B2

(12) United States Patent
Back et al.

(10) Patent No.: US 12,635,452 B2
(45) Date of Patent: May 19, 2026

(54) SUBSTRATE PROCESSING APPARATUS

(71) Applicant: JUSUNG ENGINEERING CO., LTD., Gwangju-si (KR)

(72) Inventors: In Woo Back, Gwangju-si (KR); Jong Chul Kim, Gwangju-si (KR); Yeong Seop Byeon, Gwangju-si (KR); In Cheol Yeo, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 413 days.

(21) Appl. No.: 17/772,677

(22) PCT Filed: Nov. 2, 2020

(86) PCT No.: PCT/KR2020/015119
§ 371 (c)(1),
(2) Date: Apr. 28, 2022

(87) PCT Pub. No.: WO2021/096126
PCT Pub. Date: May 20, 2021

(65) Prior Publication Data
US 2024/0167879 A1 May 23, 2024

(30) Foreign Application Priority Data

Nov. 11, 2019 (KR) ........................ 10-2019-0143792

(51) Int. Cl.
*H10P 72/00* (2026.01)
*G01J 5/00* (2022.01)
(Continued)

(52) U.S. Cl.
CPC ........ *H10P 72/0602* (2026.01); *G01J 5/0007* (2013.01); *G01J 5/025* (2013.01);
(Continued)

(58) Field of Classification Search
None
See application file for complete search history.

(56) References Cited

U.S. PATENT DOCUMENTS 8,150,242 B2 *  4/2012  Merry ............... H01L 21/67248
                                             392/407
8,724,976 B2 *  5/2014  Merry .................... C23C 16/52
                                             392/407
(Continued)

FOREIGN PATENT DOCUMENTS

JP       H0815038 A      1/1996
JP       H11106289 A     4/1999
(Continued)

OTHER PUBLICATIONS

Machine translation of JP 2009-182866 A (Year: 2009).*
International Search Report for PCT/KR2020/015119, mailed Feb. 8, 2021.

*Primary Examiner* — Thomas R Artman
(74) *Attorney, Agent, or Firm* — Renaissance IP Law Group LLP

(57) ABSTRACT

The present inventive concept relates to a substrate processing apparatus comprising: a chamber providing a processing space; a lid for covering the top of the chamber; a substrate support part supporting at least one substrate and rotating about a rotation axis such that the substrate passes through an imaging area; a gas injection part for injecting a process gas toward the substrate support part; an area image capturing part for capturing an image of the imaging area to obtain a thermal image of the imaging area; and a calculation part for calculating the temperature data of the substrate from the thermal image.

14 Claims, 7 Drawing Sheets

(51) Int. Cl.
    *G01J 5/02*          (2022.01)
    *G01J 5/48*          (2022.01)

(52) U.S. Cl.
    CPC ....... *G01J 5/485* (2022.01); *G01J 2005/0077* (2013.01); *G01J 2005/0092* (2013.01)

(56)          References Cited

U.S. PATENT DOCUMENTS

| | | | |
|---|---|---|---|
| 8,992,079 B2 | 3/2015 | Moroi et al. | |
| 9,212,949 B2 * | 12/2015 | Krampert | G01K 15/005 |
| 9,543,171 B2 * | 1/2017 | Waldmann | H01L 21/67109 |
| 9,653,340 B2 * | 5/2017 | Boguslavskiy | H01L 21/68764 |
| 9,790,597 B2 | 10/2017 | Yamaga | |
| 10,134,617 B2 * | 11/2018 | Gurary | C23C 16/46 |
| 11,837,445 B2 * | 12/2023 | Hwang | C23C 16/45551 |
| 2010/0111511 A1 | 5/2010 | Merry et al. | |
| 2012/0183915 A1 * | 7/2012 | Merry | C23C 16/52 |
| | | | 432/49 |
| 2012/0304926 A1 | 12/2012 | Boguslavskiy et al. | |
| 2012/0307233 A1 | 12/2012 | Boguslavskiy et al. | |
| 2013/0130187 A1 * | 5/2013 | Moroi | F27D 21/00 |
| | | | 432/32 |
| 2015/0187620 A1 | 7/2015 | Gurary et al. | |
| 2015/0276487 A1 * | 10/2015 | Krampert | G01J 5/0007 |
| | | | 250/338.3 |
| 2015/0364388 A1 * | 12/2015 | Waldmann | H01L 21/67109 |
| | | | 438/5 |
| 2017/0003171 A1 * | 1/2017 | Wada | G01J 5/0007 |
| 2017/0226639 A1 * | 8/2017 | Yamaga | C23C 16/46 |
| 2019/0157125 A1 * | 5/2019 | Gurary | H01L 21/68735 |
| 2021/0358719 A1 * | 11/2021 | Hwang | H01L 21/02274 |
| 2022/0392790 A1 * | 12/2022 | Back | H01L 21/68764 |
| 2024/0055233 A1 * | 2/2024 | Hwang | H01J 37/32449 |
| 2024/0167879 A1 * | 5/2024 | Back | H01L 22/12 |

FOREIGN PATENT DOCUMENTS

| | | |
|---|---|---|
| JP | 2001153966 A | 6/2001 |
| JP | 2004219091 A | 8/2004 |
| JP | 2009182866 A | 8/2009 |
| JP | 2012079731 A | 4/2012 |
| JP | 2017015689 A | 1/2017 |
| KR | 20120132379 A | 12/2012 |
| KR | 20130045536 A | 5/2013 |
| KR | 20170093719 A | 8/2017 |
| TW | 201613005 A | 4/2016 |

* cited by examiner

SUBSTRATE PROCESSING APPARATUS

TECHNICAL FIELD

The present disclosure relates to a substrate processing apparatus which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed on a substrate, and examples of the processing process include a deposition process of depositing a thin film including a specific material on the substrate, a photo process of selectively exposing a portion of a thin film by using a photosensitive material, an etching process of removing the selectively exposed portion of the thin film to form a pattern, etc. Such a processing process is performed on a substrate by a substrate processing apparatus.

A substrate processing apparatus of the related art includes a substrate supporting unit which supports a substrate and a gas injection unit which injects a processing gas toward the substrate supporting unit. The substrate supporting unit rotates about a rotational shaft. As the substrate supporting unit rotates about the rotational shaft, a substrate supported by the substrate supporting unit passes through a region under the gas injection unit. In this process, a processing process is performed on the substrate by using the processing gas injected by the gas injection unit.

In such a processing process, a temperature of the substrate acts as an important factor. In order to reflect the temperature of the substrate in the processing process, in the related art, a temperature distribution of the substrate is obtained by using a thermocouple (TC) wafer before performing the processing process.

The substrate processing apparatus of the related art may not obtain the temperature distribution of the substrate in the middle of performing the processing process, and thus, the processing process is performed by predicting a temperature distribution of the substrate by using a temperature distribution of the substrate obtained before performing the processing process. However, due to many variables which occur while the processing process is being performed, a considerable difference between a predicted temperature distribution of the substrate and a real temperature distribution of the substrate occurs inevitably while the processing process is being performed. Due to such a difference, the substrate processing apparatus of the related art has a problem where it is difficult to secure the uniformity of quality of a substrate on which the processing process is completed.

DISCLOSURE

Technical Problem

The present inventive concept is devised to solve the above-described problem and is for providing a substrate processing apparatus for enhancing the uniformity of quality of a substrate on which a processing process is completed.

Technical Solution

To accomplish the above-described objects, the present inventive concept may include the following elements.

An apparatus for processing substrate according to the present inventive concept may include: a chamber providing a processing space; a lid covering an upper portion of the chamber; a substrate supporting unit supporting at least one substrate and rotating about a rotational shaft so that a substrate passes through a photographing region; a gas injection unit injecting a processing gas toward the substrate supporting unit; a region photographing unit photographing the photographing region to obtain a thermal image of the photographing region; and a calculation unit calculating temperature data of a substrate from the thermal image.

Advantageous Effect

According to the present inventive concepts, the following effects may be obtained.

The present inventive concept is implemented to calculate temperature data while a processing process is being performed on a substrate. Accordingly, the uniformity of quality of a substrate on which the processing process is completed may be enhanced.

The present inventive concept is implemented to photograph a region by using a region photographing unit to calculate temperature data of a substrate. Therefore, the present inventive concept may enhance the easiness of an alignment operation of aligning the region photographing unit and may shorten a time taken in performing the alignment operation of the region photographing unit. Accordingly, the present inventive concept may increase an operating rate to increase the productivity of a substrate on which the processing process is completed.

MODE FOR INVENTION

Hereinafter, an embodiment of a substrate processing apparatus according to the present inventive concept will be described in detail with reference to the accompanying drawings.

Figure 1:
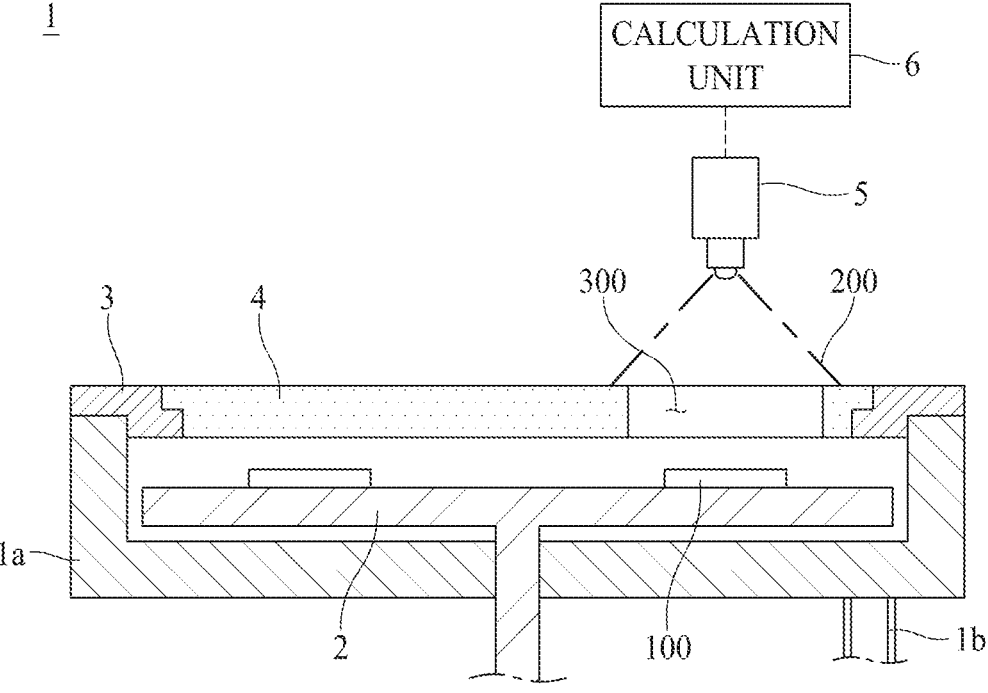
FIG. 1 is a schematic side cross-sectional view of a substrate processing apparatus according to the present inventive concept.

Referring to FIG. 1, a substrate processing apparatus 1 according to the present inventive concept performs a processing process on a substrate 100. The substrate 100 may be a glass substrate, a silicon substrate, a metal substrate, or the like. The substrate processing apparatus 1 according to the present inventive concept may perform a processing process such as a deposition process of depositing a thin film on the substrate 100 and an etching process of removing a portion of the thin film deposited on the substrate 100. Hereinafter, an embodiment where the substrate processing apparatus 1 according to the present inventive concept performs the deposition process will be described, but it is obvious to those skilled in the art to implement an embodiment where the substrate processing apparatus 1 according to the present inventive concept performs another processing process such as the etching process.

The substrate processing apparatus 1 according to the present inventive concept may include a substrate supporting unit 2, a lid 3, a gas injection unit 4, a region photographing unit 5, and a calculation unit 6.

Referring to FIG. 1, the substrate supporting unit 2 supports the substrate 100. The substrate supporting unit 2 may be coupled to an inner portion of a chamber 1a providing a processing space where the processing process is performed. The processing space may be disposed between the substrate supporting unit 2 and the lid 3. A substrate entrance (not shown) may be coupled to the chamber 1a. The substrates 100 may pass through the substrate entrance and may be loaded into the chamber 1a by using a loading apparatus (not shown). When the processing process is completed, the substrates 100 may pass through the substrate entrance and may be unloaded to the outside of the chamber 1a by using an unloading apparatus (not shown). An exhaust part 1b for exhausting a gas, which is in the processing space, to the outside may be coupled to the chamber 1a.

The substrate supporting unit 2 may rotate about a rotational shaft 2a. As the substrate supporting unit 2 rotates about the rotational shaft 2a, the substrate 100 supported by the substrate supporting unit 2 passes through a region under the gas injection unit 4 while rotating about the rotational shaft 2a. In this process, a processing process may be performed on the substrate 100 by using a processing gas injected by the gas injection unit 4. The substrate supporting unit 2 may support at least one substrate 100. When the substrate supporting unit 2 supports a plurality of substrates 100, the substrates 100 may be disposed apart from one another with respect to the rotational shaft 2a. A rotation device (not shown) which provides the rotational force may be coupled to the substrate supporting unit 2.

Figure 2:
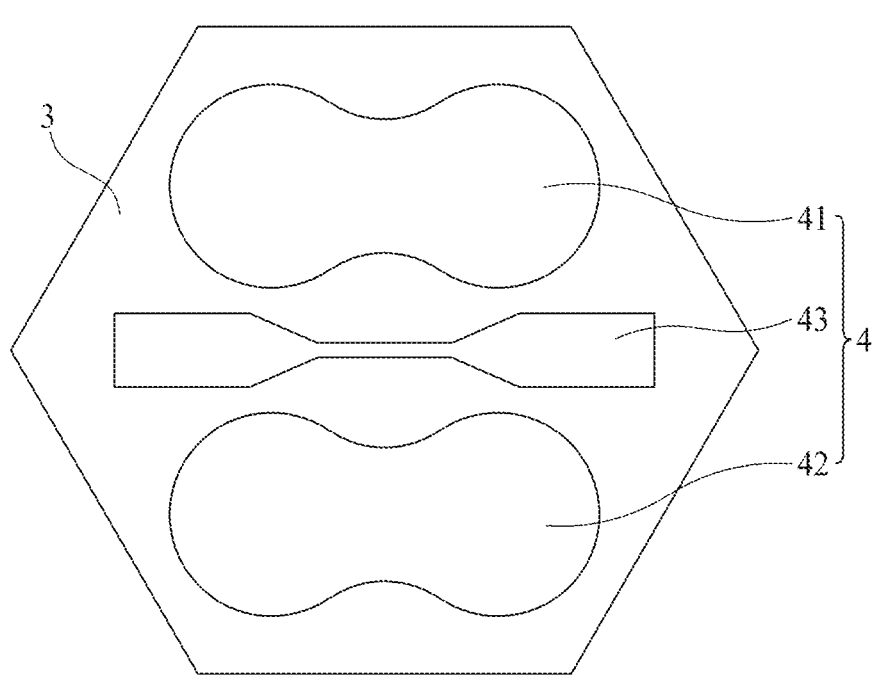
FIGS. 2 and 3 are schematic plan views illustrating an embodiment of a gas injection unit in a substrate processing apparatus according to the present inventive concept.
Figure 3:
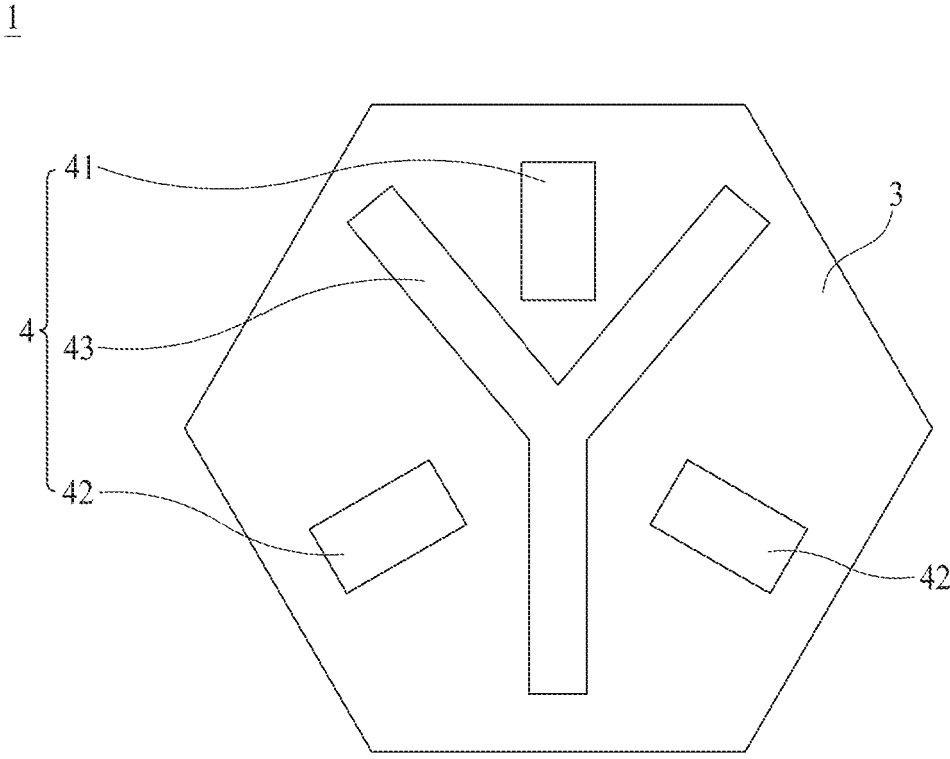

Referring to FIGS. 1 to 3, the lid 3 covers an upper portion of the chamber 1a. The lid 3 may be disposed upward apart from the substrate supporting unit 2. In FIGS. 2 and 3, the lid 3 is illustrated as being implemented in a hexagonal structure, but is not limited thereto and may be implemented in a cylindrical structure, an oval structure, or a polygonal structure such as an octagonal structure. The chamber 1a may be implemented in a shape corresponding to the lid 3.

Referring to FIGS. 1 to 3, the gas injection unit 4 injects a processing gas toward the substrate supporting unit 2. The gas injection unit 4 may be coupled to the lid 3. Although not shown, the gas injection unit 4 may be coupled to the chamber 1a so that the gas injection unit 4 is disposed between the lid 3 and the substrate supporting unit 2.

The gas injection unit 4 may include a first gas injection module 41 which injects a first gas and a second gas injection module 42 which injects a second gas. The first gas may be a source gas, and the second gas may be a reactant gas. The first gas injection module 41 and the second gas injection module 42 may be disposed apart from each other with respect to the rotational shaft 2a. Therefore, when the substrate supporting unit 2 rotates about the rotational shaft 2a, the substrate 100 sequentially passes through a region under the first gas injection module 41 and a region under the second gas injection module 42 while rotating about the rotational shaft 2a. Accordingly, a processing process may be performed on the substrate 100 by using the first gas and the second gas. The gas injection unit 4 may include a plurality of first gas injection modules 41. The gas injection unit 4 may include a plurality of second gas injection modules 42.

The gas injection unit 4 may include a purge gas injection module 43 which injects a purge gas. The purge gas injection module 43 may inject the purge gas, and thus, may divide a first region which the first gas is injected into and a second region which the second gas is injected into. Therefore, the purge gas injection module 43 may prevent the first gas and the second gas from being mixed between the first region and the second region. When the substrate supporting unit 2 rotates about the rotational shaft 2a, the substrate 100 passes through a region under the purge gas injection module 43 while rotating about the rotational shaft 2a. In this process, a residual gas remaining on the substrate 100 may be purged by the purge gas. As illustrated in FIG. 2, the purge gas injection module 43 may be implemented in a dumbbell shape which passes through a region between the first gas injection module 41 and the second gas injection module 42. As illustrated in FIG. 3, the purge gas injection module 43 may be implemented in a Y-shape. Although not shown, the purge gas injection module 43 may be implemented in various shapes on the basis of the number of first gas injection modules 41 and the number of second gas injection modules 42. The gas injection unit 4 may include a plurality of purge gas injection modules 43.

Referring to FIGS. 1 to 4, the region photographing unit 5 photographs a photographing region 200 to obtain a thermal image of the photographing region 200. The thermal image is a region image of the photographing region and includes a temperature. The region photographing unit 5 may be a camera which obtains the thermal image of the photographing region 200 by using an infrared ray (IR). The substrate supporting unit 2 may rotate about the rotational shaft 2a so that the substrate 100 passes through the photographing region 200. Therefore, the substrate processing apparatus 1 according to the present disclosure may obtain a temperature distribution of the substrate 100 while the processing process is being performed, and thus, may change a process condition on the basis of the temperature distribution of the substrate 100. Accordingly, the substrate processing apparatus 1 according to the present disclosure may enhance the uniformity of quality of a substrate on which the processing process is completed. Also, the substrate processing apparatus 1 according to the present disclosure may photograph a region by using the region photographing unit 5 to obtain the temperature distribution of the substrate 100, and thus, comparing with a comparative example which obtains the temperature distribution of the substrate 100 by using a line scanner, there are the following advantages.

First, in the comparative example which obtains the temperature distribution of the substrate 100 by using the line scanner, a position of the line scanner should be precisely aligned with respect to a position of the substrate 100. Therefore, in the comparative example, it is difficult to perform an alignment operation on the line scanner at an initial setting stage, and moreover, a considerable time is taken in performing the alignment operation on the line scanner, whereby there is a disadvantage where a time taken in initial setting is delayed. Such a disadvantage affects adversely a process of remounting the line scanner after maintenance and repair.

In this context, an embodiment, which photographs a region by using the region photographing unit 5 to obtain the temperature distribution of the substrate 100, is implemented so that an allowable error range of an alignment operation of the region photographing unit 5 with respect to a position of the substrate 100 is greater than the comparative example. This is because the region photographing unit 5 photographs a region to obtain the thermal image, and thus, the error range is compensated for through correction in the thermal image. Therefore, comparing with the comparative example, the substrate processing apparatus 1 according to the present disclosure may reduce a time taken in performing the alignment operation of the region photographing unit 5, and thus, has an advantage where a time taken in initial setting and a time taken in remounting are shortened. Accordingly, the substrate processing apparatus 1 according to the present disclosure may increase an operating rate, thereby increasing the productivity of a substrate on which the processing process is completed.

Second, in the comparative example which obtains the temperature distribution of the substrate 100 by using the line scanner, the temperature distribution of the substrate 100 is obtained by continuously performing point measurement to measure one line. However, because the point measurement is performed in a state where a substrate is rotating, the comparative example has a measurement time difference which occurs between a first measurement point and a second measurement point. Accordingly, the comparative example is reduced in accuracy of the temperature distribution of the substrate 100.

In this context, in an embodiment which photographs a region by using the region photographing unit 5 to obtain the temperature distribution of the substrate 100, the temperature distribution of the substrate 100 is obtained by obtaining the thermal image through momentary photographing in a state where a substrate is rotating. Therefore, a measurement time difference between measurement points does not occur in the thermal image which is obtained through momentary photographing by the region photographing unit 5. Accordingly, comparing with the comparative example, an embodiment may enhance an accuracy of the temperature distribution of the substrate 100.

Third, in the comparative example which obtains the temperature distribution of the substrate 100 by using the line scanner, despite point measurement being continuously performed, a different error value occurs for each measurement point whenever the measurement point is performed, due to a peak-to-peak period. Due to this, in the comparative example, an accuracy of the temperature distribution of the substrate 100 is reduced.

In this context, in an embodiment which photographs a region by using the region photographing unit 5 to obtain the temperature distribution of the substrate 100, because the thermal image is obtained through momentary photographing, the same error value occurs in all measurement points even when an error value occurs in the thermal image. Accordingly, comparing with the comparative example, an embodiment may enhance an accuracy of the temperature distribution of the substrate 100.

Figure 4:
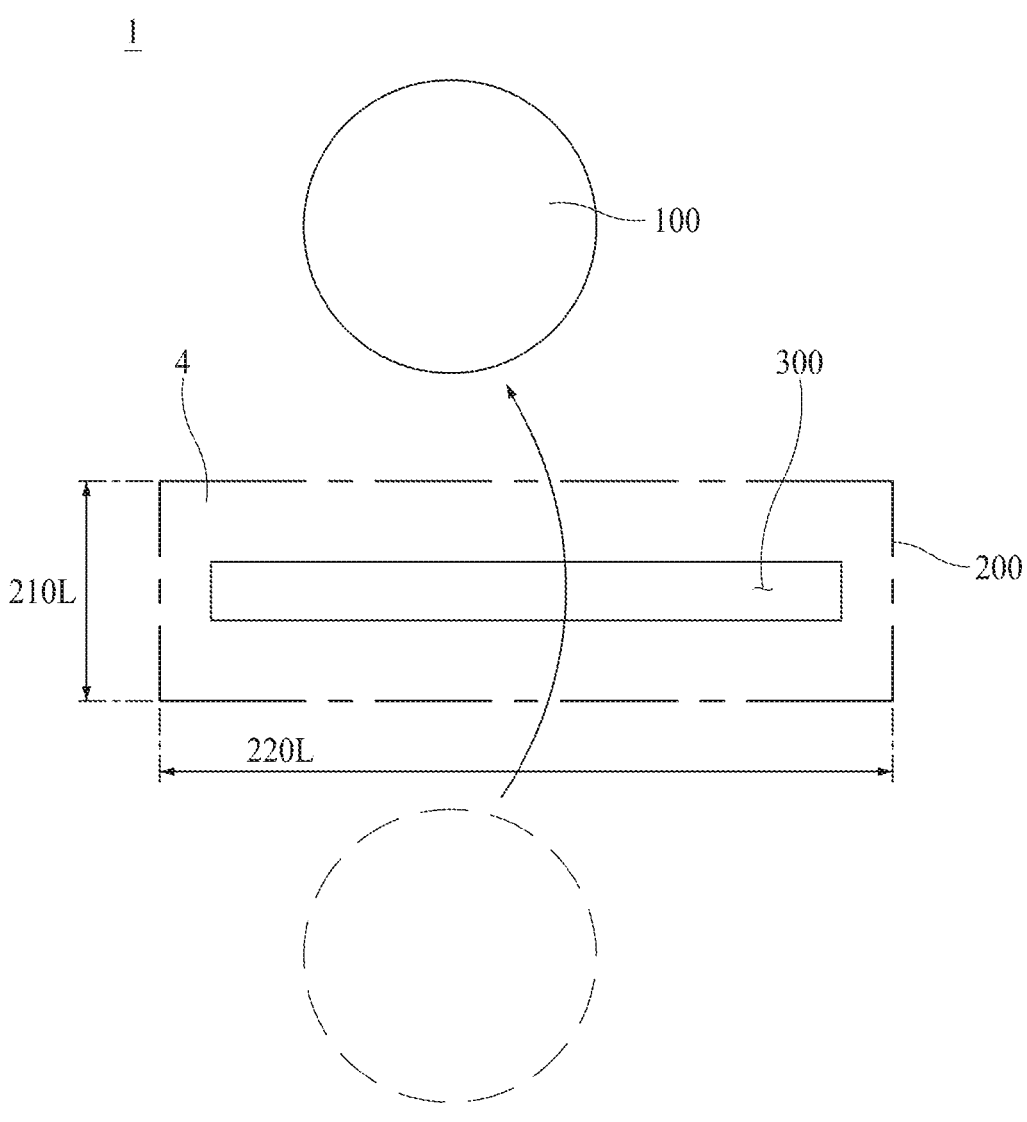
FIG. 4 is a conceptual plan view illustrating an operation of obtaining a thermal image in a substrate processing apparatus according to the present inventive concept.
Figure 5:
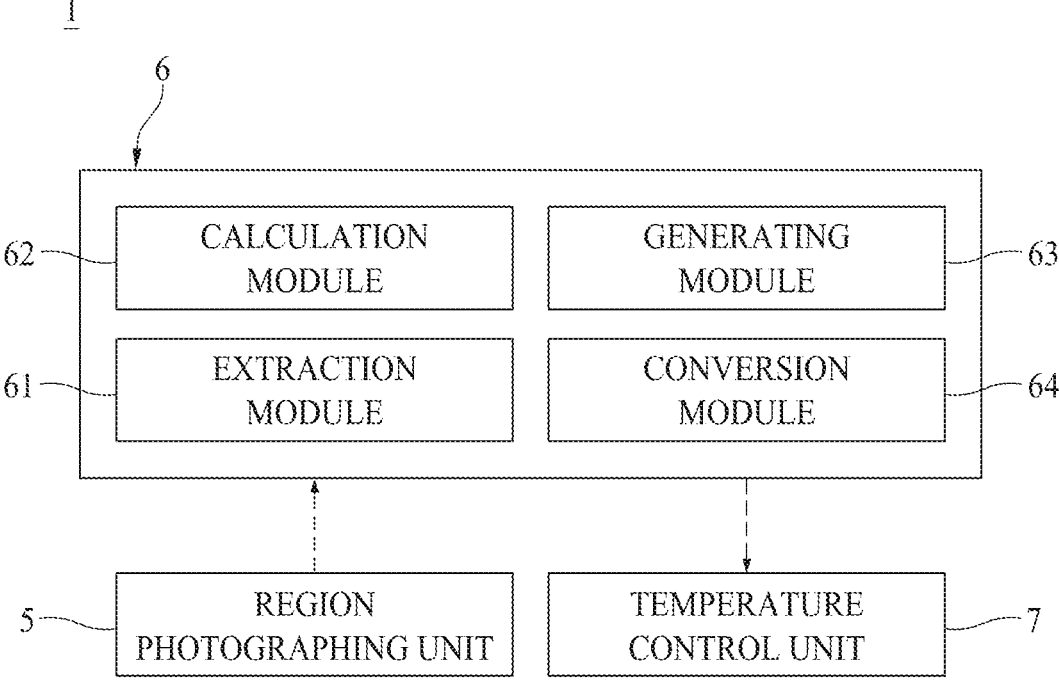
FIG. 5 is a schematic block diagram of a substrate processing apparatus according to the present inventive concept.
Figure 6:
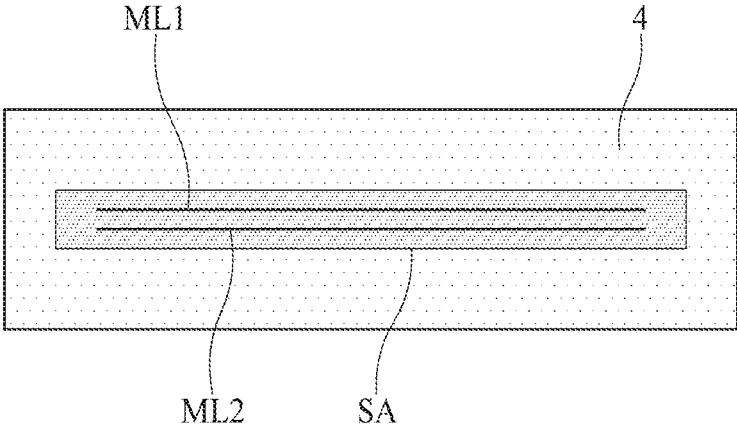
FIG. 6 is a conceptual plan view illustrating a thermal image where a first measurement line and a second measurement line are displayed, in a substrate processing apparatus according to the present inventive concept.

The photographing region 200 may be formed to have a first length 210L which is shorter than a diameter of the substrate 100, with respect to a direction in which the substrate 100 rotates about the rotational shaft 2a. A second length 220L of the photographing region 200 vertical to the first length 210L may be set to be longer than the diameter of the substrate 100. Therefore, the region photographing unit 5 may obtain a thermal image including a portion of the substrate 100. Accordingly, the substrate processing apparatus 1 according to the present inventive concept may obtain a plurality of thermal images, thereby obtaining a temperature distribution of all of the substrate 100. In FIG. 4, the photographing region 200 is illustrated as being formed in a rectangular shape, but is not limited thereto and the photographing region 200 may be formed in another shape such as an oval shape.

The region photographing unit 5 may be disposed outside the processing space. In this case, the region photographing unit 5 may obtain the thermal image including the processing space through a measurement hole 300 disposed in the photographing region 200. Accordingly, the region photographing unit 5 may obtain the thermal image including the substrate 100 which passes through a region under the measurement hole 300.

The measurement hole 300 may be formed in the gas injection unit 4. In this case, the region photographing unit 5 may be disposed at a position corresponding to the measurement hole 300, over the gas injection unit 4. The measurement hole 300 may be formed in the purge gas injection module 43 in the gas injection unit 4. The measurement hole 300 may be formed to pass through the purge gas injection module 43. In this case, the measurement hole 300 may be formed at a position apart from purge holes (not shown) for injecting the purge gas in the purge gas injection module 43.

The measurement hole 300 may be formed in the lid 3. In this case, the region photographing unit 5 may be disposed at a position corresponding to the measurement hole 300, over the lid 3. The measurement hole 300 may be formed to pass through the lid 3. In this case, the measurement hole 300 may be formed at a portion, where the gas injection unit 4 is not disposed, of the lid 3.

The measurement hole 300 may be formed to have a size which is less than that of the photographing region 200. With respect to FIG. 4, the measurement hole 300 may be formed to have a shorter length than the diameter of the substrate 100 in a lengthwise direction, and moreover, may be formed to have a longer length than the diameter of the substrate 100 in a widthwise direction. Here, when a center of the substrate 100 is set with respect to a circular rotation path which rotates about the rotational shaft 2a, the lengthwise direction may correspond to a tangent-line direction with respect to the circular rotation path. The widthwise direction is a direction vertical to the lengthwise direction. In FIG. 4, the measurement hole 300 is illustrated as being formed in a rectangular shape, but is not limited thereto and the measurement hole 300 may be formed in another shape such as an oval shape.

Referring to FIGS. 1 to 7, the calculation unit 6 calculates temperature data of the substrate 100 from the thermal image. In the thermal image, a temperature of each point of a substrate may be displayed in color corresponding thereto. A color-based temperature may be previously stored in the calculation unit 6 in a lookup table form. By matching such stored data with the thermal image, the calculation unit 6 may calculate temperature data of a point-based temperature of the substrate.

The calculation unit 6 may include an extraction module 61 and a calculation module 62.

The extraction module 61 extracts pieces of candidate data for obtaining the temperature data. The extraction module 61 may extract first candidate data (illustrated in FIG. 7A) of a point-based temperature of a substrate corresponding to a first measurement line ML1 (illustrated in FIG. 6) from the thermal image and may extract second candidate data (illustrated in FIG. 7B) of a point-based temperature of a substrate corresponding to a second measurement line ML2 (illustrated in FIG. 6) from the thermal image. The first measurement line ML1 and the second measurement line ML2 may be disposed in parallel. In a case where the measurement hole 300 is provided, the first measurement line ML1 and the second measurement line ML2 may be disposed in parallel in a widthwise direction of the measurement hole 300. In this case, the first measurement line ML1 and the second measurement line ML2 may be disposed apart from each other in a lengthwise direction of the measurement hole 300. In each of a graph of first candidate data of FIG. 7A and a graph of second candidate data of FIG. 7B, the abscissa axis may correspond to a length of the substrate 100 passing through the photographing region 200. As described above, each of the first candidate data and the second candidate data may include a point-based temperature of the substrate 100.

The extraction module 61 may determine an interval between the first measurement line ML1 and the second measurement line ML2 on the basis of a separation distance between the substrate 100 and the region photographing unit 5. The separation distance between the substrate 100 and the region photographing unit 5 may correspond to a height of the region photographing unit 5 with respect to the substrate 100. For example, the extraction module 61 may determine the interval between the first measurement line ML1 and the second measurement line ML2 as an interval between pixels of the region photographing unit 5 corresponding to the separation distance between the substrate 100 and the region photographing unit 5. Therefore, the substrate processing apparatus 1 according to the present inventive concept may set the first candidate data based on the first measurement line ML1 and the second candidate data based on the second measurement line ML2 to correspond to a position which is closest to the substrate 100. Accordingly, in a case where a point at which a temperature is abnormally measured is in one piece of candidate data of the first candidate data and the second candidate data, even when a temperature of a corresponding point is corrected with reference to one piece of other candidate data, the substrate processing apparatus 1 according to the present inventive concept may secure temperature data sufficient to check the temperature distribution of the substrate 100. For example, the extraction module 61 may extract the first candidate data and the second candidate data by using the first measurement line ML1 and the second measurement line ML2 which are apart from each other by an interval of 0.3 mm. In this case, the separation distance between the substrate 100 and the region photographing unit 5 may be 300 mm, the region photographing unit 5 may obtain the thermal image having a 640×480 resolution, and the interval between the pixels of the region photographing unit 5 may be 0.3 mm.

The extraction module 61 may extract a portion, other than a portion corresponding to a pre-set temperature or less, of the thermal image as a substrate portion SA (illustrated in FIG. 6) and may extract the first candidate data and the second candidate data by using the first measurement line ML1 and the second measurement line ML2 with respect to the extracted substrate portion SA. The pre-set temperature may be previously set by a worker. In a case where the measurement hole 300 is provided, the portion corresponding to the pre-set temperature or less may be the gas injection unit 4 or the lid 3. A corresponding portion may have a temperature which is too lower than a temperature of the substrate 100 passing through a region under the measurement hole 300, and thus, the extraction module 61 may extract the substrate portion SA by using the pre-set temperature. Accordingly, the substrate processing apparatus 1 according to the present inventive concept may extract a position of the substrate 100 from the thermal image, and then, may extract the first candidate data and the second candidate data, thereby enhancing an accuracy of an operation of obtaining the temperature distribution of the substrate 100. Also, the substrate processing apparatus 1 according to the present inventive concept may more increase an allowable error range of an alignment operation of the region photographing unit 5 with respect to the position of the substrate 100, thereby more shortening a time taken in performing the alignment operation of the region photographing unit 5.

The calculation module 62 may calculate temperature data of a point-based temperature of a substrate included in the thermal image by using the first candidate data and the second candidate data. The first candidate data and the second candidate data are provided from the extraction module 61 through wired communication, wireless communication, or the like.

The calculation module 62 may determine a point, exceeding a pre-set reference temperature ST, of one piece of candidate data of the first candidate data and the second candidate data as a temperature of one piece of other candidate data, thereby calculating the temperature data. The reference temperature ST may be considered to be abnormally higher than noise, and thus, may be previously set by a worker. For example, the calculation module 62 may exclude a point-based temperature of a first section T1 exceeding the reference temperature ST in the first candidate data illustrated in FIG. 7A and may determine, as a point-based temperature of a corresponding section, a point-based temperature of a second section T2 corresponding to the first section in the second candidate data illustrated in FIG. 7B. Accordingly, the substrate processing apparatus 1 according to the present inventive concept may prevent an accuracy of the temperature data from being reduced by noise.

The calculation module 62 may determine a point, which is equal to or less than the reference temperature ST, in all of the first candidate data and the second candidate data are as an average temperature of a temperature of the first candidate data and a temperature of the second candidate data, thereby calculating the temperature data. For example, the calculation module 62 may determine an average temperature of a point-based temperature of a section other than the first section T1 in the first candidate data illustrated in FIG. 7A and a point-based temperature of a section other than the second section T2 in the second candidate data illustrated in FIG. 7B.

As described above, the calculation module 62 may determine a point exceeding the reference temperature ST in one piece of candidate data of the first candidate data and the second candidate data as a temperature of one piece of other candidate data and may determine a point, which is equal to or less than the reference temperature ST, in all of the first candidate data and the second candidate data as an average temperature of the temperature of the first candidate data and the temperature of the second candidate data, thereby calculating the temperature data. Accordingly, the substrate processing apparatus 1 according to the present inventive concept may more enhance an accuracy of the temperature data. When a point exceeding the reference temperature ST occurs in all of the first candidate data and the second candidate data, the calculation module 62 may transmit an alarm to a worker.

Figure 7:
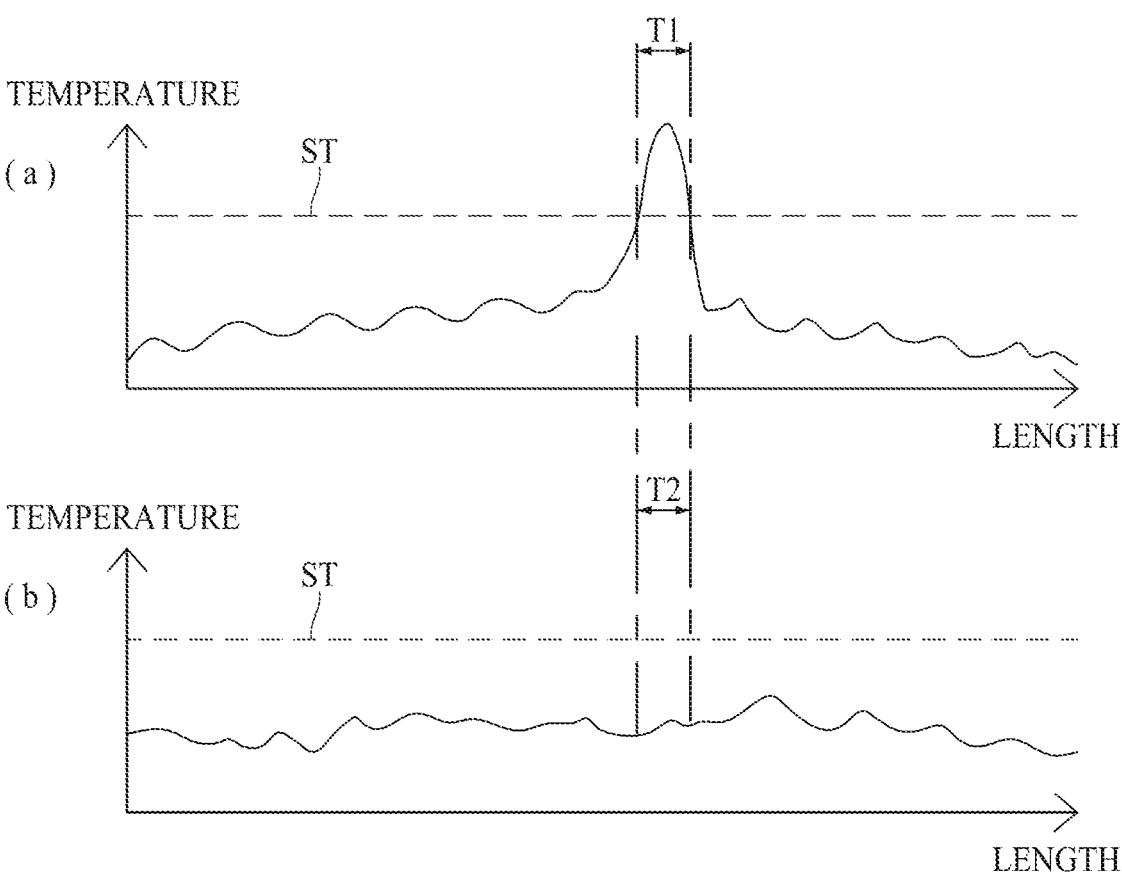
FIG. 7 is a graph showing first candidate data of a point-based temperature of a substrate corresponding to the first measurement line and second candidate data of a point-based temperature of a substrate corresponding to the second measurement line, in a substrate processing apparatus according to the present inventive concept.

Referring to FIGS. 1 and 7, the calculation module 6 may include a generating module 63 and a conversion module 64.

The generating module 63 generates an oval detection image representing the temperature distribution of the substrate 100 by using a plurality of temperature data. As illustrated in FIG. 4, as the substrate 100 passes through the photographing region 200 through rotation, the region photographing unit 5 may obtain a thermal image including a portion of the substrate 100, and thus, the calculation unit 6 may calculate the temperature data of each of the thermal images by using the extraction module 61 and the calculation module 62. By collecting pieces of temperature data calculated in this manner, the generating module 63 may generate the oval detection image. The reason that the oval detection image is generated even when the substrate 100 is circular in shape is because the thermal image is obtained in a process of rotating the substrate 100 with respect to the rotational shaft 2a, and thus, an outer portion of the substrate 100 disposed at a position opposite to the rotational shaft 2a moves by a greater distance than an inner portion of the substrate 100 disposed near the rotational shaft 2a. The pieces of temperature data may be provided from the calculation module 62 to the generating module 63 through wired communication, wireless communication, or the like.

The generating module 63 may generate the oval detection image representing a temperature distribution corresponding one rotation of a substrate by using a rotation speed of the substrate supporting unit 2 and a photographing time of the thermal image used to calculate the pieces of temperature data. Therefore, in a case where the pieces of temperature data are calculated in a process of supporting a plurality of substrates 100 on the substrate supporting unit 2 and rotating the substrates 100 by 360 degrees with respect to the rotational shaft 2a a plurality of times, the generating module 63 may generate the oval detection image from pieces of temperature data, corresponding to a case where the same substrate 100 rotates same times, among the pieces of temperature data.

The conversion module 64 converts the oval detection image into a circular detection image corresponding to the substrate 100. Therefore, a worker may check the temperature distribution of the substrate 100 by using a temperature distribution which is differentially displayed in color on the basis of a temperature in the circular detection image. Therefore, the substrate processing apparatus 1 according to the present disclosure may provide the worker with the circular detection image corresponding to the substrate 100, thereby enhancing the easiness of an operation of checking the temperature distribution of the substrate 100. Although not shown, the conversion module 64 may provide the circular detection image to a display apparatus (not shown). The oval detection image may be provided from the generating module 63 to the conversion module 64 through wired communication, wireless communication, or the like.

The conversion module 64 may calculate point-based coordinates of the substrate 100 by using a rotation speed of the substrate supporting unit 2 and a distance apart from the rotational shaft 2a of the substrate supporting unit 2 for each point of the substrate 100, and then, may convert the oval detection image into the circular detection image on the basis of the calculated coordinates. As the rotation speed of the substrate supporting unit 2 increases, the substrate supporting unit 2 moves by a larger distance, and moreover, in a point where the distance apart from the rotational shaft 2a is larger, the substrate supporting unit 2 moves by a relatively larger distance, whereby the conversion module 64 calculates point-based coordinates of the substrate 100 by using a rotation speed of the substrate supporting unit 2 and a distance apart from the rotational shaft 2a for each point of the substrate 100. In this case, the point-based coordinates of the substrate 100 may correspond to absolute coordinates with respect to a real substrate 100. When the point-based coordinates of the substrate 100 are calculated, the conversion module 64 may move a point-based temperature of the substrate 100 on the basis of the absolute coordinates to convert the oval detection image into the circular detection image.

Referring to FIGS. 1 to 7, the substrate processing apparatus 1 according to the present inventive concept may be implemented to reflect temperature data, calculated by the calculation unit 6, in a process condition of the processing process. In this case, the substrate processing apparatus 1 according to the present inventive concept may include a temperature control unit 7.

The temperature control unit 7 controls a temperature of the substrate 100 supported on the substrate supporting unit 2. The temperature control unit 7 may control a temperature of the substrate supporting unit 2, and thus, may control the temperature of the substrate 100 by using the substrate supporting unit 2. In this case, the temperature control unit 7 may be installed in the substrate supporting unit 2. Although not shown, the temperature control unit 7 may be implemented to control the temperature of the substrate 100 by using electricity. In this case, the temperature control unit 7 may be implemented as an electric heater. Although not shown, the temperature control unit 7 may be implemented to control the temperature of the substrate 100 by using a temperature control fluid. In this case, the temperature control unit 7 may include a pipe installed in the substrate supporting unit 2, a pump which supplies the temperature control fluid to the pipe, and a control unit which controls a temperature of the temperature control fluid supplied to the pipe by the pump.

The temperature control unit 7 may control the temperature of the substrate 100, supported by the substrate supporting unit 2, to a pre-set processing temperature by using the temperature data calculated by the calculation unit 6. The pre-set processing temperature may vary based on the kind of the processing process, the kind of the substrate 100, and the kind of a thin film and may be previously set by a worker.

The gas injection unit 4 may stop injection of a gas to the substrate supporting unit 2 until the temperature of the substrate 100 supported by the substrate supporting unit 2 is controlled to the processing temperature by using the temperature data calculated by the calculation unit 6. When it is checked that the temperature of the substrate 100 supported by the substrate supporting unit 2 is controlled to the processing temperature by using the temperature data calculated by the calculation unit 6, the gas injection unit 4 may start the injection of the gas to the substrate supporting unit 2. Accordingly, the substrate processing apparatus 1 according to the present inventive concept may enhance the uniformity of quality of a substrate on which the processing process is completed.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. An apparatus for processing substrate, the apparatus comprising:

a chamber providing a processing space;

a lid covering an upper portion of the chamber;

a substrate supporting unit supporting at least one substrate and rotating about a rotational shaft so that a substrate passes through a photographing region;

a gas injection unit injecting a processing gas toward the substrate supporting unit;

a region photographing unit photographing the photographing region to obtain a thermal image of the photographing region; and a calculation unit calculating temperature data of a substrate from the thermal image, wherein the calculation unit comprises:

an extraction module extracting first candidate data of a point-based temperature of a substrate corresponding to a first measurement line from the thermal image and extracting second candidate data of a point-based temperature of a substrate, corresponding to a second measurement line parallel to the first measurement line, from the thermal image, both the first candidate data and the second candidate data being extracted from the thermal image obtained at a certain moment; and a calculation module calculating temperature data of a point-based temperature of a substrate included in the thermal image by using the first candidate data and the second candidate data, wherein the first candidate data includes a first temperature corresponding to a first point on the first measurement line and the second candidate data includes a second temperature corresponding to a second point which is a point on the second measurement line corresponding to the first point, and wherein the calculation module is configured to (i) determine an average temperature of the first and second temperatures as a point-based temperature corresponding to the first and second points if both the first and second temperatures are equal to or lower than a predetermined reference temperature, (ii) determine the second temperature as the point-based temperature corresponding to the first and second points if only the first temperature among the first and second temperatures is higher than the predetermined reference temperature, and (iii) transmit an alarm if both the first and second temperatures are higher than the predetermined reference temperature.

2. The apparatus of claim 1, wherein a measurement hole disposed in the photographing region is provided in the lid, and the region photographing unit is disposed over the lid and obtains the thermal image including a substrate passing through a region under the measurement hole by using the measurement hole.

3. The apparatus of claim 2, wherein the extraction module determines an interval between the first measurement line and the second measurement line on the basis of a separation distance between a substrate and the region photographing unit.

4. The apparatus of claim 2, wherein the extraction module extracts a portion, other than a portion corresponding to a pre-set temperature or less, of the thermal image as a substrate portion and extracts the first candidate data and the second candidate data corresponding to the extracted substrate portion.

5. The apparatus of claim 1, wherein a measurement hole disposed in the photographing region is provided in the gas injection unit, and the region photographing unit is disposed over the gas injection unit and obtains the thermal image including a substrate passing through a region under the measurement hole by using the measurement hole.

6. The apparatus of claim 5, wherein the extraction module determines an interval between the first measurement line and the second measurement line on the basis of a separation distance between a substrate and the region photographing unit.

7. The apparatus of claim 5, wherein the extraction module extracts a portion, other than a portion corresponding to a pre-set temperature or less, of the thermal image as a substrate portion and extracts the first candidate data and the second candidate data corresponding to the extracted substrate portion.

8. The apparatus of claim 1, wherein the extraction module determines an interval between the first measurement line and the second measurement line on the basis of a separation distance between a substrate and the region photographing unit.

9. The apparatus of claim 1, wherein the first measurement line and the second measurement line are apart from each other by an interval of 0.3 mm.

10. The apparatus of claim 1, wherein the extraction module extracts a portion, other than a portion corresponding to a pre-set temperature or less, of the thermal image as a substrate portion and extracts the first candidate data and the second candidate data corresponding to the extracted substrate portion.

11. The apparatus of claim 1, wherein the calculation unit comprises:

a generating module generating an oval detection image representing the temperature distribution of the substrate by using a plurality of temperature data; and a conversion module converting the oval detection image into a circular detection image corresponding to a substrate.

12. The apparatus of claim 11, wherein the generating module generates the oval detection image representing a temperature distribution corresponding one rotation of a substrate by using a rotation speed of the substrate supporting unit and a photographing time of the thermal image used to calculate the pieces of temperature data, and the conversion module calculates point-based coordinates of a substrate by using a rotation speed of the substrate supporting unit and a distance apart from a rotational shaft of the substrate supporting unit for each point of the substrate, and then, converts the oval detection image into the circular detection image on the basis of the calculated coordinates.

13. The apparatus of claim 1, further comprising a temperature control unit for controlling a temperature of a substrate supported on the substrate supporting unit, wherein the temperature control unit controls the temperature of the substrate by using temperature data calculated by the calculation unit.

14. The apparatus of claim 1, wherein the gas injection unit stops injection of a gas to the substrate supporting unit until a temperature of a substrate supported by the substrate supporting unit is controlled to a pre-set processing temperature by using the temperature data calculated by the calculation unit.

* * * * *